United States Patent
Lee et al.

(10) Patent No.: US 7,403,443 B2
(45) Date of Patent: Jul. 22, 2008

(54) LAYOUT FOR DISTRIBUTED SENSE AMPLIFIER DRIVER IN MEMORY DEVICE

(75) Inventors: Jung-hwa Lee, Suwon-si (KR); Hong-jun Lee, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 245 days.

(21) Appl. No.: 11/452,231

(22) Filed: Jun. 14, 2006

(65) Prior Publication Data

US 2007/0014141 A1    Jan. 18, 2007

(30) Foreign Application Priority Data

Jul. 18, 2005    (KR) .................. 10-2005-0064756

(51) Int. Cl.
*G11C 8/00* (2006.01)
(52) U.S. Cl. .................. 365/230.06; 365/230.03; 365/230.08; 365/185.11; 365/189.08
(58) Field of Classification Search ............ 365/230.06, 365/230.03, 230.08, 185.11, 189.08
See application file for complete search history.

(56) References Cited

U.S. PATENT DOCUMENTS 7,184,347 B2 *   2/2007   Lee et al. .................. 365/207
7,336,518 B2 *   2/2008   Chang et al. .............. 365/51

FOREIGN PATENT DOCUMENTS

| JP | 06-176571 | 6/1994 |
| JP | 11-328951 | 11/1999 |
| JP | 2000-124415 | 4/2000 |
| JP | 2001-093276 | 4/2001 |
| KR | 100200760 | 3/1999 |

* cited by examiner

*Primary Examiner*—Richard T. Elms
*Assistant Examiner*—Eric Wendler
(74) *Attorney, Agent, or Firm*—Volentine & Whitt, PLLC

(57) ABSTRACT

A semiconductor memory device is disclosed having a layout including, alternating pluralities of memory cell arrays and word line driving blocks arranged next to alternating pluralities of sense amplifier blocks and conjunction blocks, such that each sense amplifier block is located lateral to a corresponding memory cell array, and each conjunction block is located lateral to a corresponding word line driving block. Each sense amplifier block alternately includes one of a supply voltage driver and a ground voltage driver.

10 Claims, 5 Drawing Sheets

LAYOUT FOR DISTRIBUTED SENSE AMPLIFIER DRIVER IN MEMORY DEVICE

BACKGROUND OF THE INVENTION

1. Field of the Invention

Embodiments of the invention relate to a layout for a semiconductor memory device. More particularly, embodiments of the invention relate to a layout for distributed sense amplifier drivers adapted for use in a semiconductor memory device.

This application claims priority to Korean Patent Application No. 10-2005-0064756 filed on Jul. 18, 2005, the subject matter of which is incorporated by reference in its entirety.

2. Description of the Related Art

FIG. 1 is a circuit diagram illustrating a conventional bit line sense amplifier 100 and drivers 110 and 120. Referring to FIG. 1, bit line sense amplifier 100 is connected to a bit line BL and a complementary bit line BLB which are in turn connected to memory cells (not shown). Bit line sense amplifier 100 includes NMOS transistors 101 and 102 which are connected in series between the bit line BL and the complementary bit line BLB. The gate and drain of NMOS transistor 101 are respectively connected to the bit lines BLB and BL, and the gate and drain of NMOS transistor 102 are respectively connected to the bit lines BL and BLB. The sources of NMOS transistors 101 and 102 are connected to a ground voltage driver 110. Ground voltage driver 110 is an NMOS transistor having a gate connected to a first driving signal LAN and a source connected to a ground voltage VSS.

Bit line sense amplifier 100 further includes PMOS transistors 104 and 105 which are connected in series between the bit line BL and the complementary bit line BLB. The gate and drain of PMOS transistor 104 are respectively connected to the bit lines BLB and BL, and the gate and drain of PMOS transistor 105 are respectively connected to the bit lines BL and BLB. The sources of PMOS transistors 104 and 105 are connected to a supply voltage driver 120. Supply voltage driver 120 is a PMOS transistor having a gate connected to a second driving signal LAP and a source connected to a supply voltage VDD.

Bit line sense amplifier 100 and respective drivers 110 and 120 may be arranged in a semiconductor memory device, such as a dynamic random access memory (DRAM), as illustrated in the layout diagrams of FIGS. 2, 3, or 4.

Referring to FIG. 2, each one of a plurality of memory cell array blocks MCA includes a plurality of memory cells arranged in a matrix, a plurality of sense amplifier blocks SA respectively connected to bit lines associated with the memory cell array blocks MCA, and a plurality of word line driving blocks SWD respectively connected to word lines associated with the memory cell array blocks MCA. In addition, a conjunction block CONJ is located between respective sense amplifier blocks SA and associated word line driving blocks SWD.

Each sense amplifier block SA includes a plurality of the bit line sense amplifiers 100, like one illustrated in FIG. 1. In each conjunction block CONJ, sense amplifier drivers, (e.g., supply voltage driver 120 and ground voltage driver 110 of FIG. 1) are arranged in an alternating manner. An N-well region is formed to pass through the conjunction blocks CONJ having supply voltage driver 120, and through the sense amplifier blocks SA having PMOS transistors 104 and 105 of bit line sense amplifier 100.

Referring to FIG. 3, ground voltage driver 110, which is included in every other conjunction block CONJ in FIG. 2, is instead included in each sense amplifier block SA. That is, ground voltage driver 110 is divided into several constituent parts and arranged in each sense amplifier block SA, to thereby increase the driving efficiency of each bit line sense amplifier 100.

Referring to FIG. 4, supply voltage driver 120, which was included in each conjunction block CONJ in FIG. 3, is instead included together with ground voltage driver 110 in each sense amplifier block SA. Each supply voltage driver 120 and ground voltage driver 110 is divided into several constituent parts and arranged in the sense amplifier block SA, to thereby increase driving efficiency of each bit line sense amplifier 100.

However, when both supply voltage driver 120 and ground voltage driver 110 are included in a sense amplifier block SA, it is difficult to conform to the tolerances established by contemporary manufacturing design rules. More particularly, it is very difficult to maintain defined margins between an N-well region for the PMOS transistor of supply voltage driver 120 and an N-active region for the NMOS transistor of ground voltage driver 110. As a result, it is difficult to manufacture the desired sense amplifier block SA illustrated in FIG. 4, for example. In order to obtain this desired sense amplifier block SA it must be expanded in its constituent area in order to obtain the necessary manufacturing margin. This expansion causes an undesirable increase in the overall chip size.

Accordingly, there is a need for an arrangement of sense amplifier drivers having increased driving efficiencies that provides a required manufacturing margin without increasing the overall chip size.

SUMMARY OF THE INVENTION

Embodiments of the invention provide a layout for sense amplifier drivers, whereby the constituent components of the drivers are effectively divided and distributed across sense amplifier blocks of a semiconductor memory device.

In one embodiment, the invention provides a memory device layout arrangement in which the ground voltage driver and supply voltage driver of a sense amplifier are divided into several constituent components and alternately distributed across different sense amplifier blocks to thereby increase driving performance for the sense amplifier while obtaining a desired manufacturing margin and without increasing overall chip size.

In another embodiment, the invention provides a semiconductor memory device having a layout comprising; alternating pluralities of memory cell arrays and word line driving blocks arranged next to alternating pluralities of sense amplifier blocks and conjunction blocks, wherein each one of the plurality of sense amplifier blocks SA is located lateral to a corresponding one of the plurality of memory cell arrays and each one of the plurality of conjunction blocks is located lateral to a corresponding one of the plurality of word line driving blocks; wherein each sense amplifier block comprises one of a supply voltage driver and a ground voltage driver.

In another embodiment, the invention provides a semiconductor memory device having a layout comprising; alternating pluralities of memory cell arrays and word line driving blocks arranged next to alternating pluralities of sense amplifier blocks and conjunction blocks, wherein each one of the plurality of sense amplifier blocks SA is located lateral to a corresponding one of the plurality of memory cell arrays and each one of the plurality of conjunction blocks is located lateral to a corresponding one of the plurality of word line driving blocks, wherein each sense amplifier block alternately comprises a supply voltage driver and then a ground voltage driver over the plurality of sense amplifier blocks.

DESCRIPTION OF EXEMPLARY EMBODIMENTS

Figure 1:
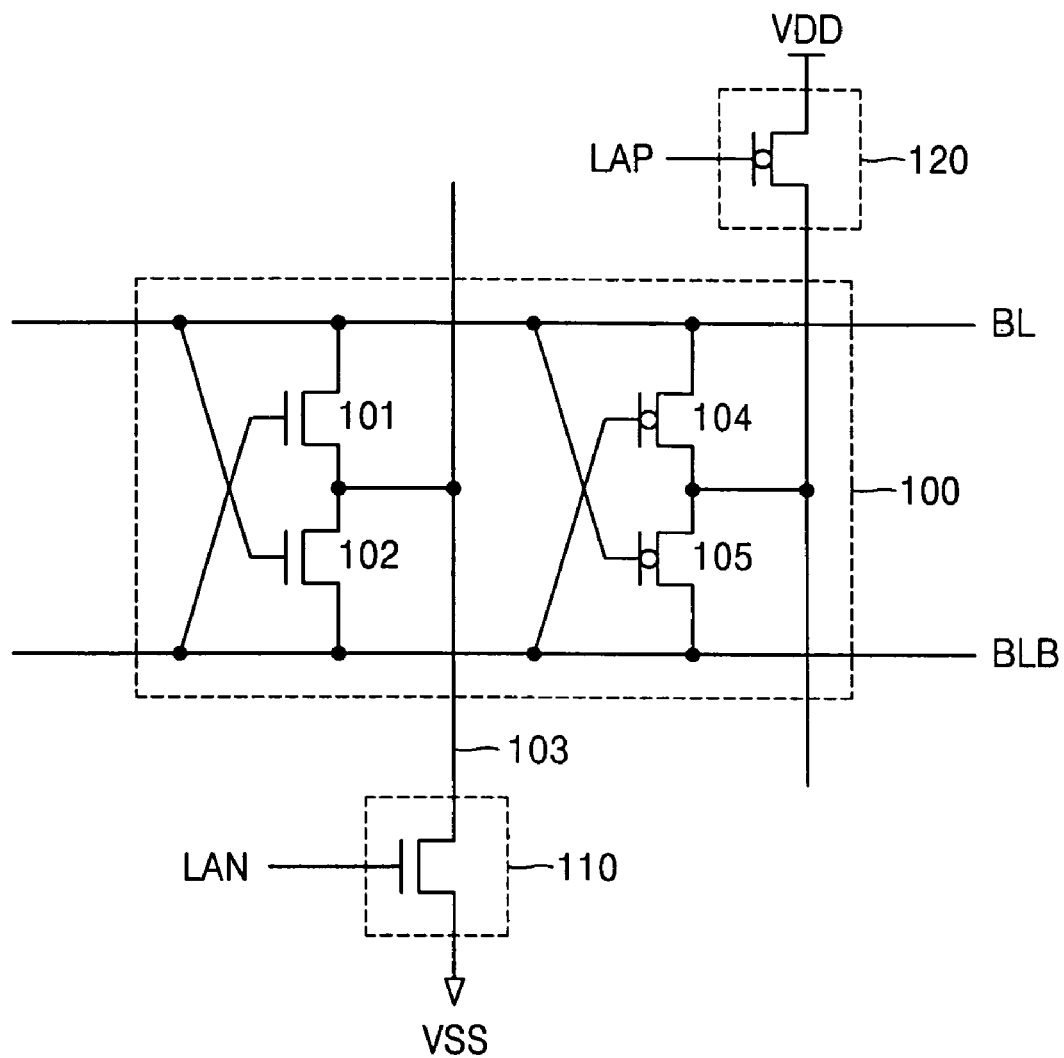
FIG. 1 is a circuit diagram of a conventional bit line sense amplifier driver.
Figure 2:
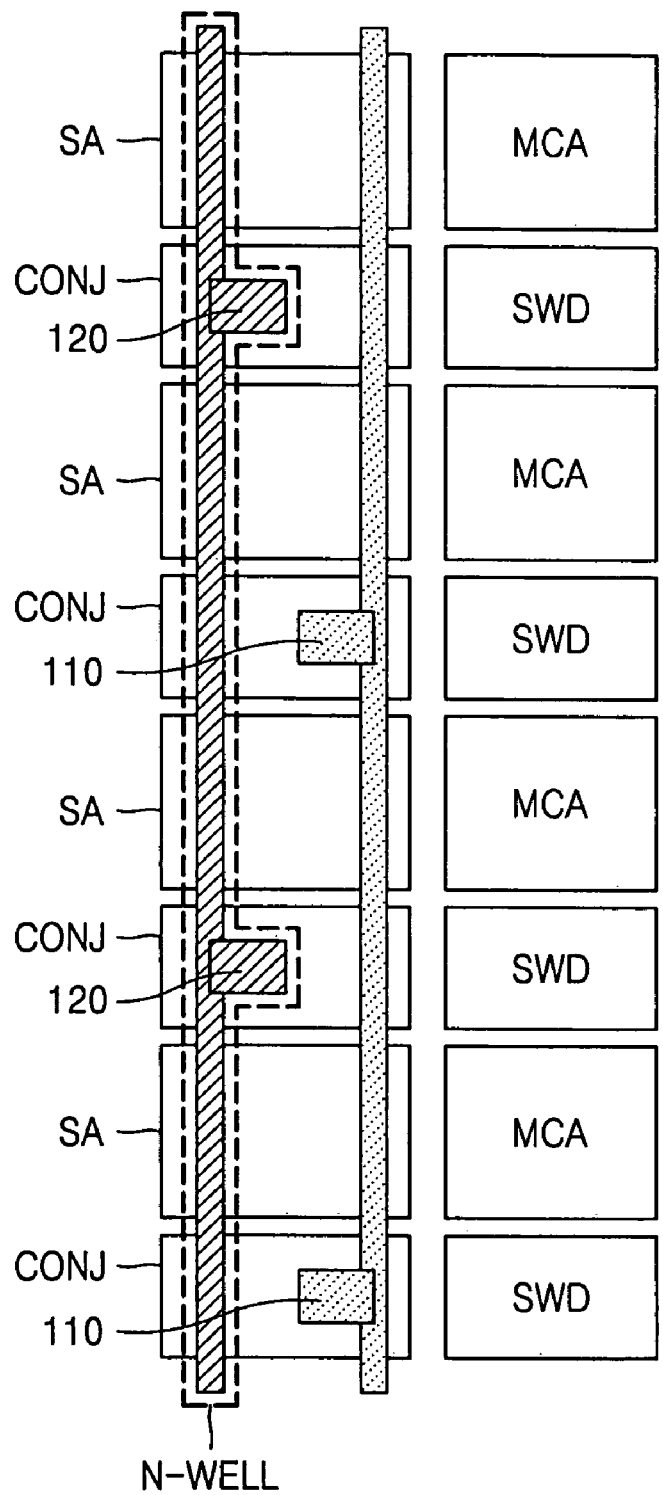
FIGS. 2 through 4 illustrate conventional layout arrangements for sense amplifier drivers.
Figure 3:
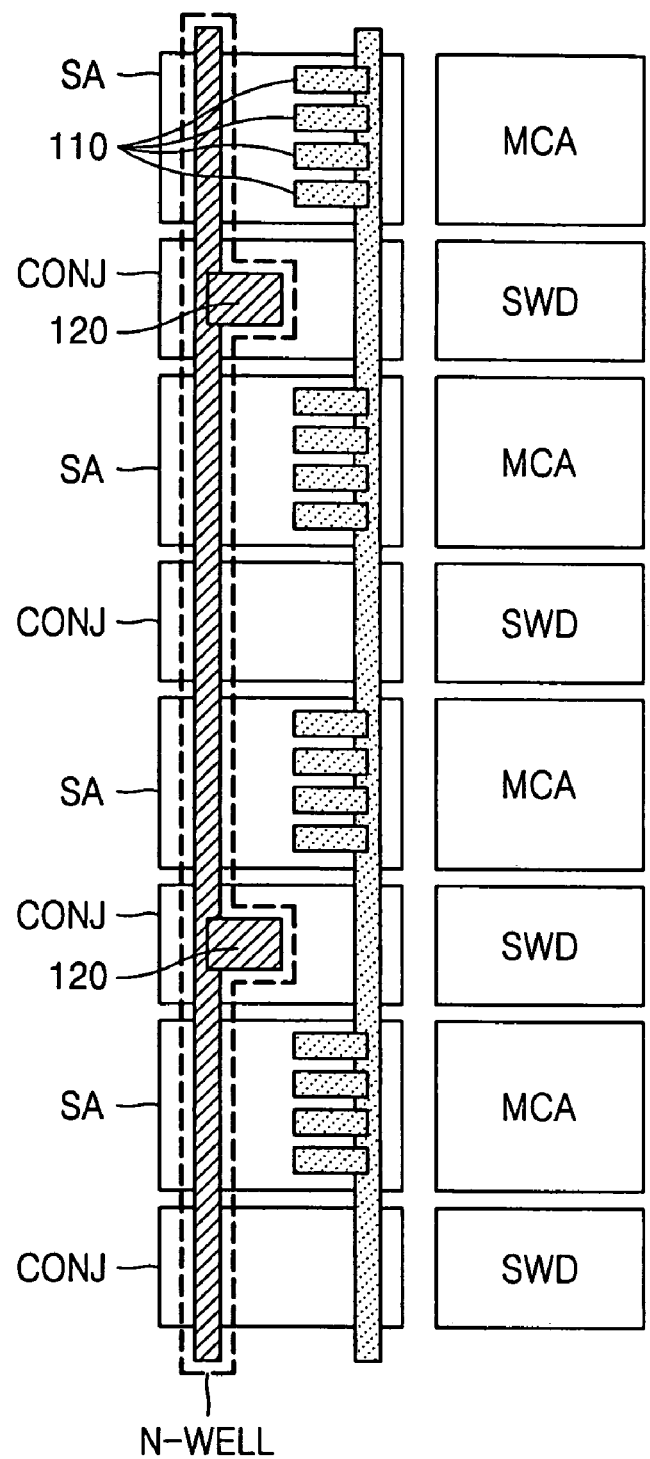

Hereinafter, exemplary embodiments of the invention will be described with reference to the accompanying drawings. Like reference numerals indicate like components throughout the specification.

Figure 5:
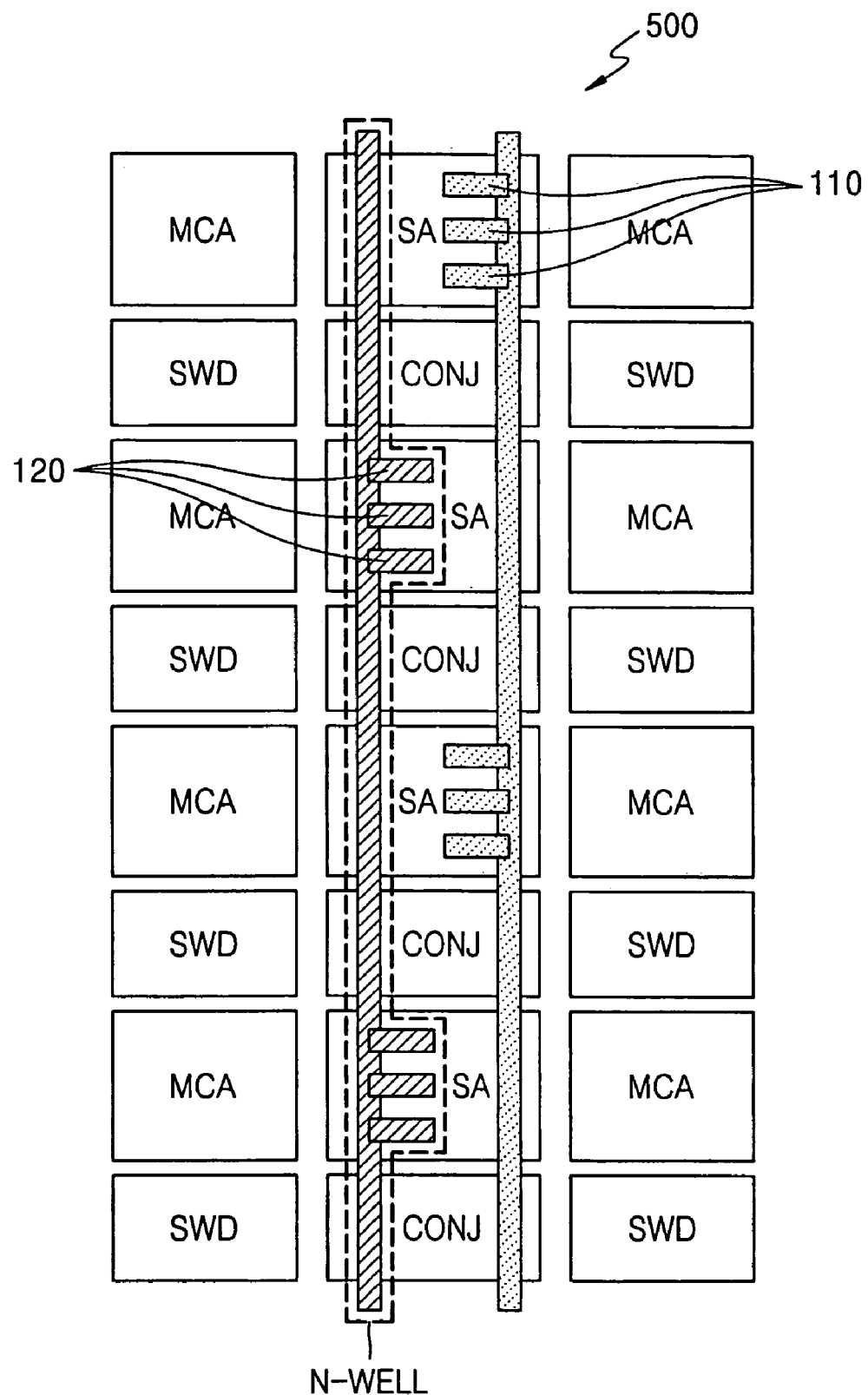
FIG. 5 illustrates a layout arrangement for sense amplifier drivers according to an embodiment of the invention.

FIG. 5 illustrates a layout arrangement of divided and distributed sense amplifier drivers according to an embodiment of the invention. Referring to FIG. 5, a plurality of sense amplifier blocks SA are sequentially arranged in relation to bit lines associated with a corresponding plurality of memory cell arrays MCA. Similarly, a plurality of word line driving blocks SWD are sequentially arranged in relation to word lines associated with the plurality of memory cell arrays MCA. In the illustrated example of FIG. 5, semiconductor memory device 500 comprises a layout of alternating pluralities of memory cell arrays MCA and word line driving blocks SWD, and a corresponding sense amplifier block SA and a laterally disposed layout of alternating pluralities of sense amplifier blocks SA and conjunction blocks CONJ. Within this layout each sense amplifier block SA is located lateral to a corresponding memory cell array MCA and each conjunction block CONJ is located lateral to a corresponding word line driving block SWD.

Each sense amplifier block SA comprises one of a ground voltage driver 110 and a supply voltage driver 120, similar to those described with reference to FIG. 1. However, ground voltage driver 110 and supply voltage driver 120 are alternately arranged within alternating ones of the plurality of sense amplifier blocks SA. For instance, a ground voltage driver 110 may be included in each odd-numbered sense amplifier block SA, and a supply voltage driver 120 may be included in each even-numbered sense amplifier block SA within the plurality of sense amplifier blocks SA.

Referring again to FIG. 5, each ground voltage driver 110 may be divided into several constituent components and distributed across each odd-numbered sense amplifier block SA, and each supply voltage driver 120 may be divided into several constituent components and distributed across each even-numbered sense amplifier block SA.

Figure 4:
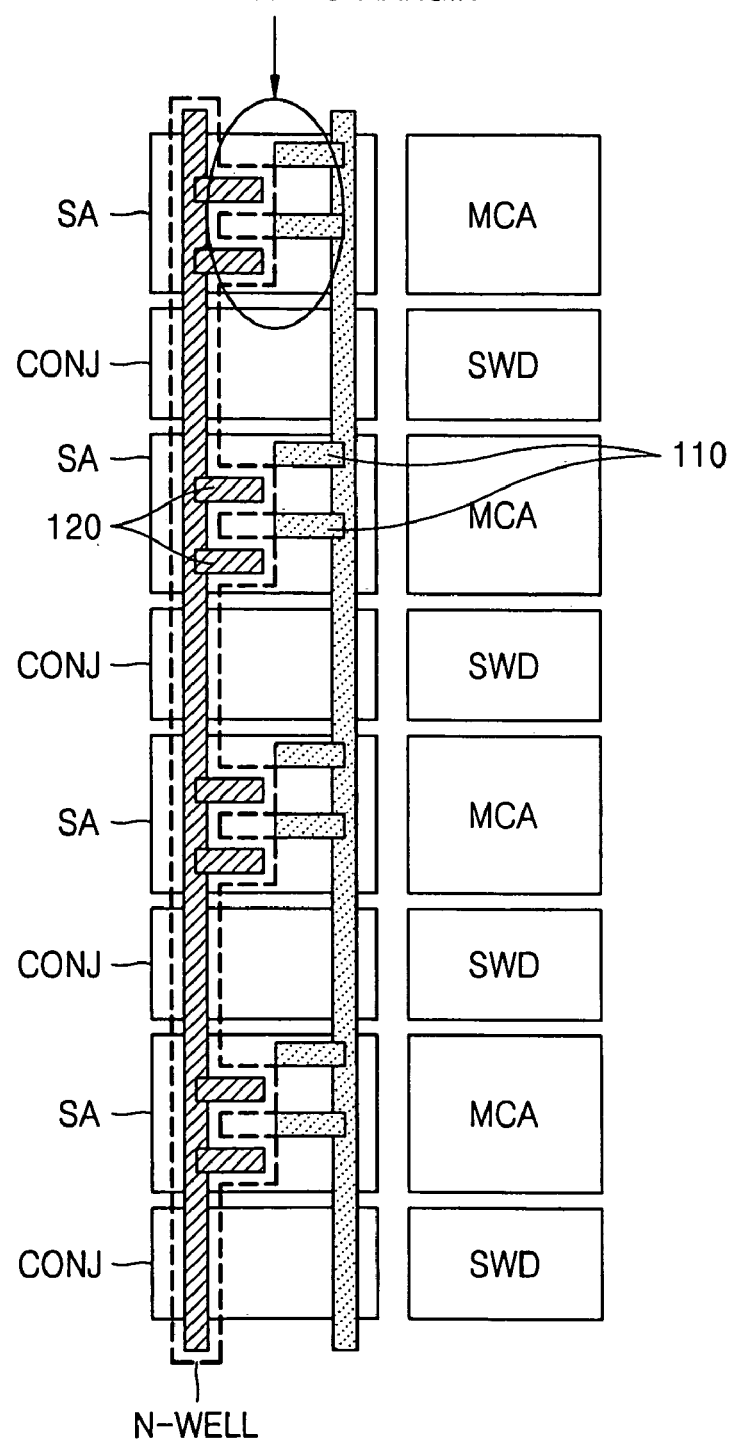

Compared to the conventional arrangement illustrated in FIG. 4, ground voltage driver 110 and supply voltage driver 120 are located in different sense amplifier blocks SA, thus eliminating the concern over manufacturing margin between N-well regions for supply voltage driver 120 and ground voltage driver 110. Accordingly, it is possible to manufacture a semiconductor memory device without increasing overall chip size. In addition, the constituent components of ground voltage driver 110 and supply voltage driver 120 are respectively divided and distributed across different sense amplifier blocks SA, thereby improving the driving performance of bit line sense amplifier 100.

While this invention has been particularly shown and described with reference to exemplary embodiments, it will be understood by those skilled in the art that various changes in form and implementation may be made to the foregoing without departing from the scope of the invention as defined by the appended claims.

What is claimed is:

1. A semiconductor memory device having a layout comprising:
    alternating pluralities of memory cell arrays and word line driving blocks arranged next to alternating pluralities of sense amplifier blocks and conjunction blocks, wherein each one of the plurality of sense amplifier blocks SA is located lateral to a corresponding one of the plurality of memory cell arrays and each one of the plurality of conjunction blocks is located lateral to a corresponding one of the plurality of word line driving blocks;
    wherein each sense amplifier block comprises one of a supply voltage driver and a ground voltage driver.

2. The device of claim 1, wherein the supply voltage driver and the ground voltage driver are respectively divided into several constituent components and distributed across the sense amplifier.

3. The device of claim 1, wherein each bit line sense amplifier comprises:
    first and second PMOS transistors connected in series between a bit line and a complementary bit line associated with the corresponding memory cell array, wherein a gate of the first PMOS transistor is connected to one of the bit line and the complementary bit and a gate for the second PMOS transistor is connected to the other one of the bit line and the complementary bit line; and
    first and second NMOS transistors connected in series between the bit line and the complementary bit line, wherein a gate of the first NMOS transistor is connected to one of the bit line and the complementary bit and a gate for the second NMOS transistor is connected to the other one of the bit line and the complementary bit line.

4. The device of claim 3, wherein the supply voltage driver comprises a third PMOS transistor having a source connected to a supply voltage, a gate connected to a first driving signal, and a drain connected to a node between the first and second PMOS transistors.

5. The device of claim 3, wherein the ground voltage driver comprises a third NMOS transistor having a source connected to the ground voltage, a gate connected to a second driving signal, and a drain connected to a node between the first and second NMOS transistors.

6. A semiconductor memory device having a layout comprising:
    alternating pluralities of memory cell arrays and word line driving blocks arranged next to alternating pluralities of sense amplifier blocks and conjunction blocks, wherein each one of the plurality of sense amplifier blocks SA is located lateral to a corresponding one of the plurality of memory cell arrays and each one of the plurality of conjunction blocks is located lateral to a corresponding one of the plurality of word line driving blocks;
    wherein each sense amplifier block alternately comprises a supply voltage driver and then a ground voltage driver over the plurality of sense amplifier blocks.

7. The device of claim 6, wherein the supply voltage driver and the ground voltage driver are respectively divided into several constituent components and distributed across the sense amplifier.

8. The device of claim 6, wherein each bit line sense amplifier comprises:
    first and second PMOS transistors connected in series between a bit line and a complementary bit line associated with the corresponding memory cell array, wherein a gate of the first PMOS transistor is connected to one of the bit line and the complementary bit and a gate for the second PMOS transistor is connected to the other one of the bit line and the complementary bit line; and first and second NMOS transistors connected in series between the bit line and the complementary bit line, wherein a gate of the first NMOS transistor is connected to one of the bit line and the complementary bit and a gate for the second NMOS transistor is connected to the other one of the bit line and the complementary bit line.

9. The device of claim 8, wherein the supply voltage driver comprises a third PMOS transistor having a source connected to a supply voltage, a gate connected to a first driving signal, and a drain connected to a node between the first and second PMOS transistors.

10. The device of claim 8, wherein the ground voltage driver comprises a third NMOS transistor having a source connected to the ground voltage, a gate connected to a second driving signal, and a drain connected to a node between the first and second NMOS transistors.

* * * * *